(12) United States Patent
Bean et al.

(10) Patent No.: US 10,727,203 B1
(45) Date of Patent: Jul. 28, 2020

(54) DIE-IN-DIE-CAVITY PACKAGING

(71) Applicant: Rockwell Collins, Inc., Cedar Rapids, IA (US)

(72) Inventors: Reginald D. Bean, Center Point, IA (US); Brandon C. Hamilton, Marion, IA (US); Steven J. Wiebers, Center Point, IA (US); Alan P. Boone, Swisher, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 15/974,057

(22) Filed: May 8, 2018

(51) Int. Cl.
| | |
|---|---|
| H01L 25/065 | (2006.01) |
| H01L 25/10 | (2006.01) |
| H01L 25/00 | (2006.01) |
| H01L 23/31 | (2006.01) |
| H01L 23/552 | (2006.01) |

(52) U.S. Cl.
CPC ...... H01L 25/0657 (2013.01); H01L 23/3107 (2013.01); H01L 23/552 (2013.01); H01L 25/105 (2013.01); H01L 25/50 (2013.01); H01L 2225/06555 (2013.01); H01L 2225/107 (2013.01)

(58) Field of Classification Search
CPC ... H01L 25/0657; H01L 25/105; H01L 25/50; H01L 23/3107; H01L 23/552; H01L 2225/107; H01L 2225/06555; H01L 2225/065; H01L 25/10; H01L 25/00; H01L 23/31

USPC .......... 257/659, 723, 778, 686, 685
See application file for complete search history.

(56) References Cited

U.S. PATENT DOCUMENTS

| | | | | |
|---|---|---|---|---|
| 7,964,450 | B2* | 6/2011 | Camacho | H01L 21/6835 257/E21.002 |
| 8,349,653 | B2* | 1/2013 | Parvarandeh | H01L 24/19 438/109 |
| 8,399,973 | B2* | 3/2013 | Oh | G11C 5/02 257/686 |
| 9,432,298 | B1* | 8/2016 | Smith | H04L 49/9057 |
| 9,524,959 | B1* | 12/2016 | Yeh | H01L 23/5383 |
| 9,559,081 | B1* | 1/2017 | Lai | H01L 23/5385 |
| 9,570,406 | B2* | 2/2017 | Dang | H01L 23/552 |
| 9,704,809 | B2* | 7/2017 | Tran | H01L 23/13 |
| 9,899,281 | B2* | 2/2018 | Shen | H01L 23/055 |
| 10,056,294 | B2* | 8/2018 | Sridharan | H01L 24/83 |
| 2008/0157316 | A1* | 7/2008 | Yang | H01L 24/24 257/685 |
| 2009/0289356 | A1* | 11/2009 | Camacho | H01L 21/6835 257/737 |
| 2014/0021610 | A1* | 1/2014 | Von Koblinski | H01L 23/44 257/741 |

(Continued)

*Primary Examiner* — Alexander O Williams
(74) *Attorney, Agent, or Firm* — Suiter Swantz pc llo (57) ABSTRACT

A system-in-package (SIP) incorporating die-in-die cavity packaging may include hybrid dies fabricated by milling or otherwise creating a cavity through the additive surfaces of a primary application specific integrated circuit (ASIC) die configured for flip-chip bonding and encapsulating a secondary die such as a Flash/non-volatile memory module, analog-digital converter (ADC), or other processing circuit into the cavity. The primary and secondary dies are then connected by the addition of redistribution layers. The resulting hybrid die may then be vertically integrated into the SIP along with additional memory modules or dies.

18 Claims, 9 Drawing Sheets

(56) References Cited

U.S. PATENT DOCUMENTS

| | | | |
|---|---|---|---|
| 2014/0054783 A1* | 2/2014 | Gong | H01L 24/97 |
| | | | 257/773 |
| 2014/0054796 A1* | 2/2014 | Gong | H01L 23/3128 |
| | | | 257/777 |
| 2014/0252655 A1* | 9/2014 | Tran | H01L 23/13 |
| | | | 257/777 |
| 2015/0115470 A1* | 4/2015 | Su | H01L 24/19 |
| | | | 257/774 |
| 2015/0235936 A1* | 8/2015 | Yu | H01L 23/49816 |
| | | | 257/738 |
| 2015/0357272 A1* | 12/2015 | Shen | H01L 23/49827 |
| | | | 257/693 |
| 2016/0247781 A1* | 8/2016 | Sung | H01L 23/13 |
| 2016/0291265 A1* | 10/2016 | Kinghorn | G02B 6/131 |
| 2017/0015548 A1* | 1/2017 | Mao | B81C 1/00873 |
| 2017/0084575 A1* | 3/2017 | Lee | H01L 25/0652 |
| 2017/0103937 A1* | 4/2017 | Hsieh | H01L 23/3675 |
| 2017/0148763 A1* | 5/2017 | Woychik | H01L 24/14 |
| 2018/0190638 A1* | 7/2018 | Chen | H01L 21/4817 |
| 2019/0051614 A1* | 2/2019 | Dimaano, Jr. | H01L 23/3128 |
| 2019/0229061 A1* | 7/2019 | Huang | H01L 21/565 |
| 2019/0244947 A1* | 8/2019 | Yu | H01L 24/19 |
| 2019/0252772 A1* | 8/2019 | Ndip | H01Q 9/0457 |
| 2019/0393172 A1* | 12/2019 | Pietambaram | H01L 24/19 |

* cited by examiner

DIE-IN-DIE-CAVITY PACKAGING

BACKGROUND

Government policies may require the use of "trusted foundries" for the production of application-specific integrated circuits (ASIC) and other sensitive microelectronics, both to ensure these devices are free from undisclosed modification or tampering and to protect these devices from unauthorized attempts at reverse engineering and recovery of device functionality. Due to the limited supply of, and limitations of, trusted foundries, restriction to said trusted foundries may preclude the customization of ASICs with modern technologies. For example, trusted foundries may not be able to offer non-volatile memory for custom ASIC designs. As another example, trusted foundry analog-digital converters (ADC) and other embedded analog technologies may be limited in capability when compared to state-of-the-art analog technologies at a mainstream foundry.

SUMMARY

In one aspect, embodiments of the inventive concepts disclosed herein are directed to a system-in package (SIP) incorporating die-in-die cavity packaging. For example, the SIP may be a vertically integrated package incorporating hybrid dies wherein a primary die (e.g., a commercial-off-the-shelf (COTS) or trusted-foundry application-specific integrated circuit (ASIC) die) has a cavity milled or otherwise integrated into its active or front side (e.g., through external solder bumps or passivation/metallization layers). A secondary die (e.g., a Flash, EEPROM, non-volatile memory, or processing circuit) is encapsulated within the cavity, and the primary and secondary dies connected with additive redistribution layers (RDL).

In a still further aspect, embodiments of the inventive concepts disclosed herein are directed to a method for fabricating a SIP incorporating die-in-die cavity packaging. A cavity is milled or otherwise created through the additive layers (e.g., passivation or metallization layers) of a primary ASIC die configured for flip-chip bonding. A hybrid die is then created by encapsulating one or more secondary dies (e.g., memory modules, analog-digital converters (ADC) or other processors) within the cavity. The primary and secondary dies are connected by the addition of redistribution layers (RDL) over the active surfaces of the dies. The hybrid die may then be encapsulated, underfilled, or vertically integrated into a package.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION OF EXEMPLARY EMBODIMENTS

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a' and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a system-in-package (SIP) and related methods for mobilizing advanced packaging and additive manufacturing technologies to alter a physical die to incorporate additional components or technologies post-foundry while preserving the security and integrity of the resulting hybrid die.

Figure 1:
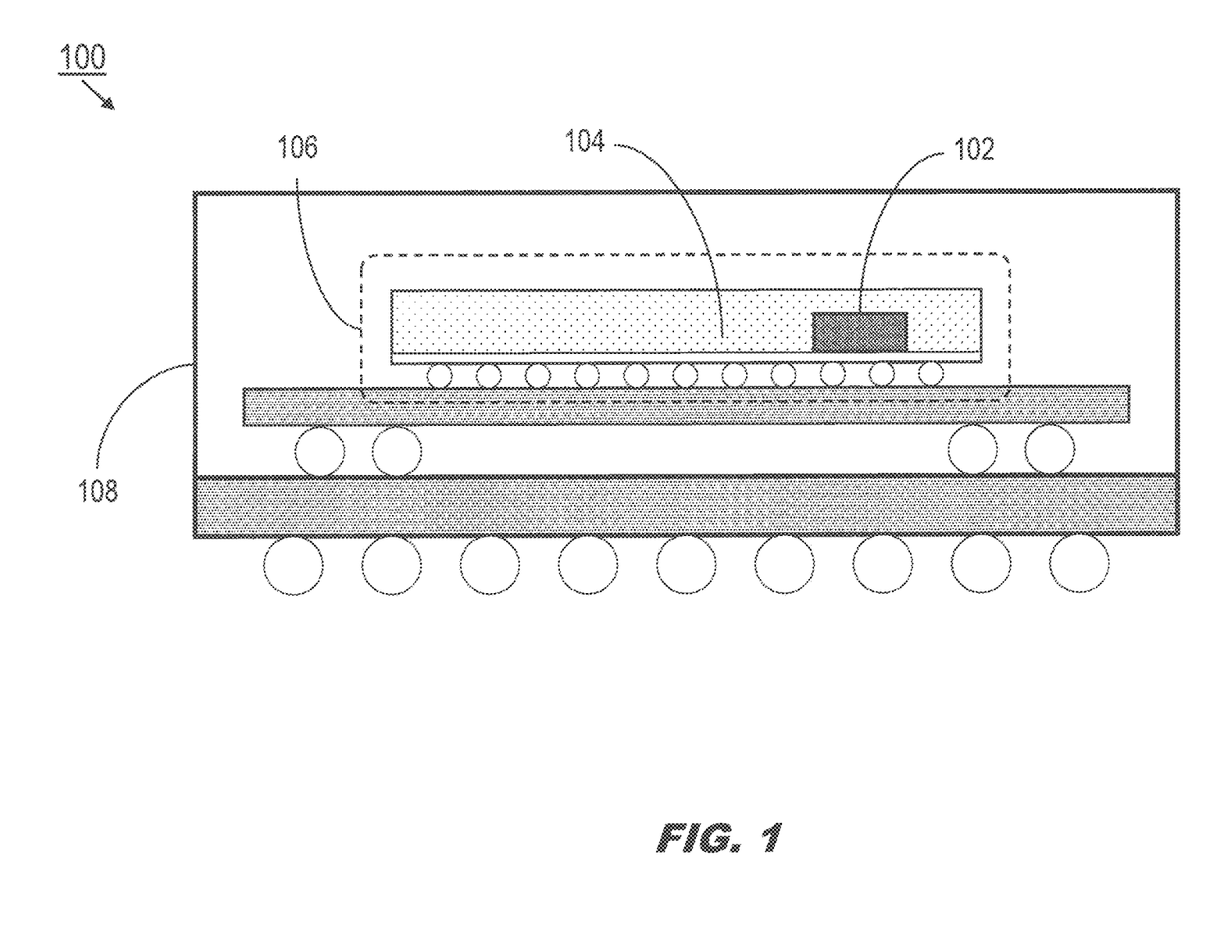
FIG. 1 illustrates an exemplary embodiment of a system-in-package (SIP) according to the inventive concepts disclosed herein.

Referring to FIG. 1, an exemplary embodiment of a system-in-package 100 (SIP) according to the inventive concepts disclosed herein may include a secondary die 102 (e.g., a Flash memory module, electrically erasable programmable read-only memory (EEPROM) module, non-volatile memory (NVM) module) encapsulated into a primary die 104 (e.g., an ASIC die), the resulting hybrid die (106) vertically integrated or otherwise incorporated into a three-dimensional (3D) package (108) or multi-die package.

Figure 2A:
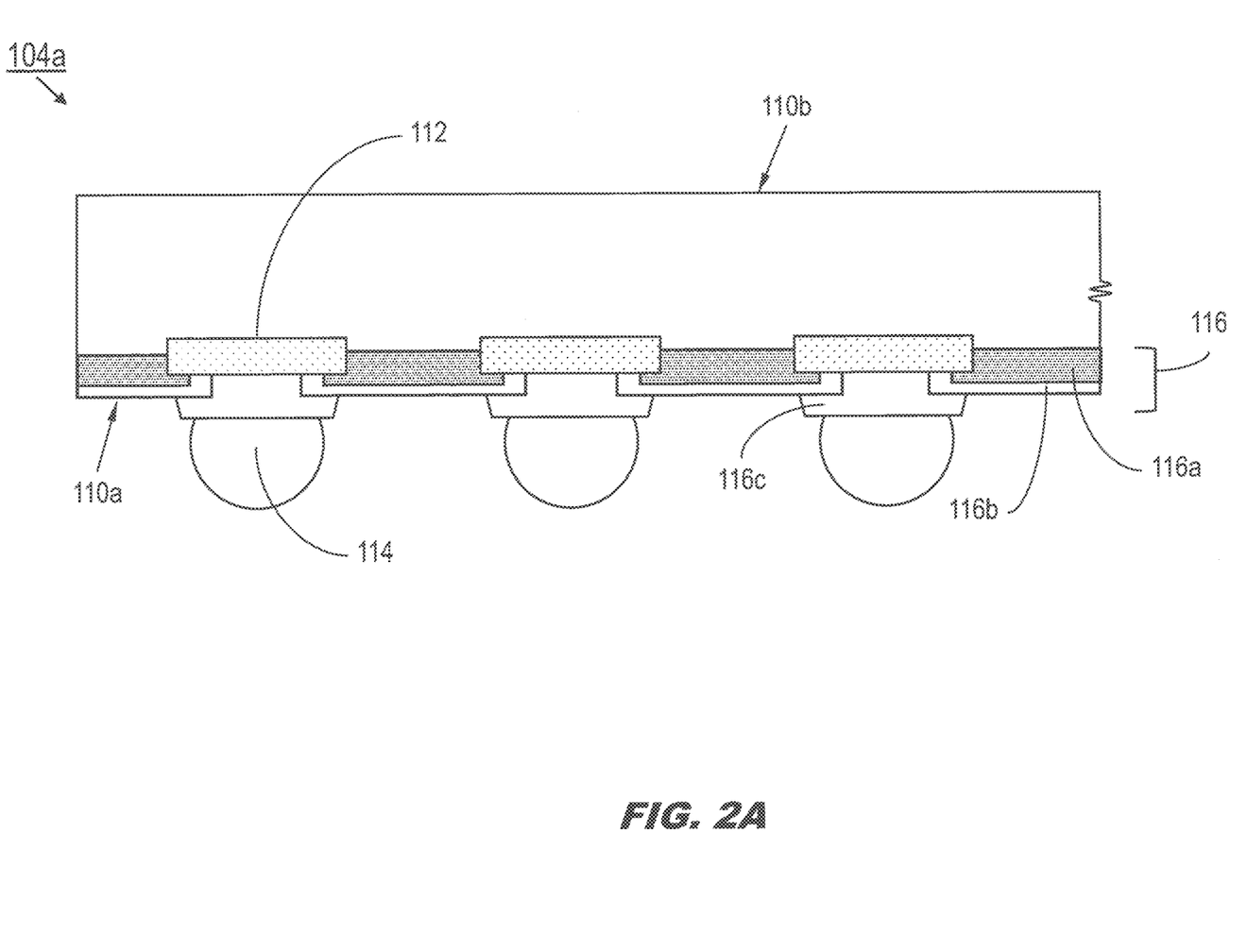
FIGS. 2A through 2C illustrate components of a hybrid die of the SIP of FIG. 1, FIGS. 3A through 3D illustrate the hybrid die of FIG. 2C.

Referring to FIG. 2A, the primary die 104a may be implemented and may function similarly to the primary die 104 of FIG. 1, except that the primary die 104a may include trusted-foundry dies or commercial-off-the-shelf (COTS) dies configured for flip-chip bonding. For example, where the primary die 104a, configured for wirebonding, may have a "front" side (e.g., wherein wirebond connections are made between the die and its packaging) and a "back" side opposite the front side, the primary die 104a may be inverted or "flipped" such that its front side (110a) corresponds to the wirebond "back" side (and its back side 110b (e.g., primary back side) similarly corresponds to the wirebond "front" side). The primary die 104a may include individual chip pads (112) with one or more additive surfaces attached thereto (e.g., via printing, metallization, photolithography, etc.) and solder bumps (114) via which the primary die 104a may be mounted to external substrates, chips, or packages. For example, the primary die 104a may incorporate one or more outer layers 116, e.g., e.g., die passivation layers 116a, repassivation layers 116b, or metallization layers 116c (e.g., under-bump metallization layers).

Figure 2B:
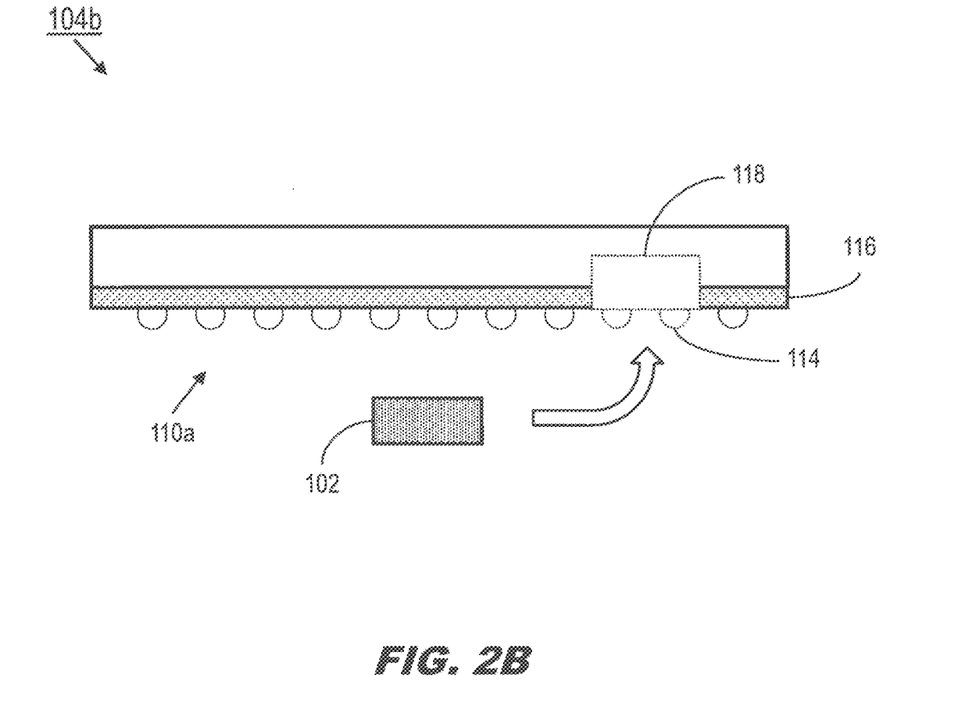

Referring to FIG. 2B, the primary die 104b may be implemented and may function similarly to the primary die 104a of FIG. 2A, except that the primary die 104b may include a cavity (118) milled or otherwise created within the primary die. For example, the cavity 118 may be created in the front surface (110a) of the primary die 104, through the outer layers 116 (which may require the temporary removal of one or more solder bumps 114) and the secondary die 102 inserted into the cavity.

Figure 2C:
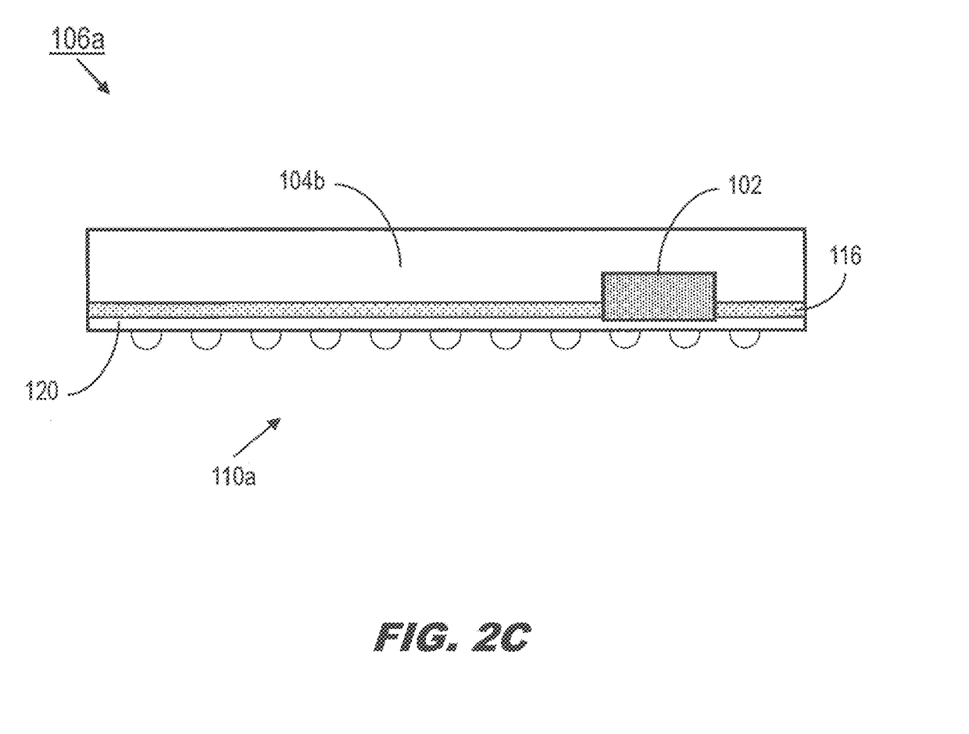

Referring to FIG. 2C, the hybrid die 106a may be implemented and may function similarly to the hybrid die 106 of FIG. 1, except that the hybrid die 106a may be formed by the encapsulation of the secondary die 102 into the primary die 104b, burying any interfaces and critical circuitry of the secondary die 102. The hybrid die 106a is completed by the addition of one or more redistribution layers 120 (RDL). For example, the RDL 120 may incorporate printed die-level interconnect, manufactured backside redistribution metallization, and any other appropriate like additive manufacturing techniques. The die-level printed interconnect may be achieved via an aerosol jetting machine capable of achieving electronic feature sizes under 1 mil (<0.001 in) by incorporating, e.g., the additive manufacturing of features via printing of liquid nanoparticle metallic or resistive inks, unfilled dielectrics, or semiconductor inks. In some embodiments, the additive outer layers 116 of the primary die 104 may include additional circuitry added to the active front side (110a) of the primary die 104b (or secondary die 102) and the RDL 120 placed three-dimensionally over the resulting non-planar surface. In some embodiments, the RDL 120 (or individual features thereof) may be partially or fully fabricated via photolithography; for example, by combining printing technologies as described above with wet etching of metal layers, feature sizes under 2 mil (<0.002 in) may be achieved for multiple metallization layers. The secondary die 102 may additionally include analog-digital converters (ADC) or other signal-processing components.

Figure 3A:
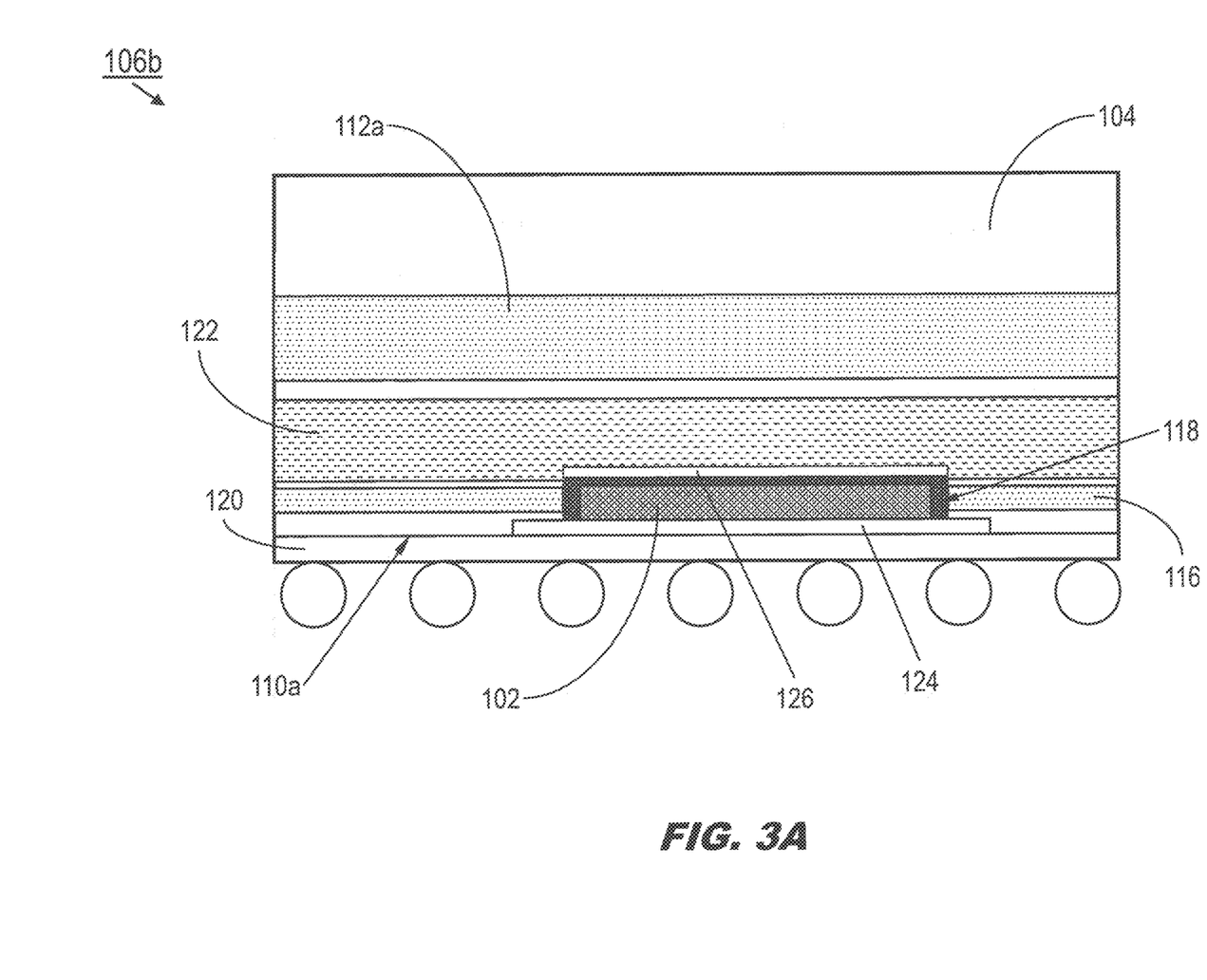

Referring to FIG. 3A, the hybrid die 106b may be implemented and may function similarly to the hybrid die 106a of FIG. 2C, except that the cavity 118 of the hybrid die 106b may be shallow enough to leave intact logic on the primary die 104 above the cavity. For example, the cavity 118 may be milled into the active front side 110a of the primary die 104, through one or more of the outer layers 116 but preserving multiple inner metal layers (122) for routing as well as the transistor layers 112a (e.g., internal logical layers) of the chip pads 1112, FIG. 2A). Prior to insertion and encapsulation of the secondary die 102 into the cavity 118, and addition of the RDL 120 and/or interconnect layers (124), one or more layers of shielding (126) may be printed or otherwise installed into the cavity.

Figure 3B:
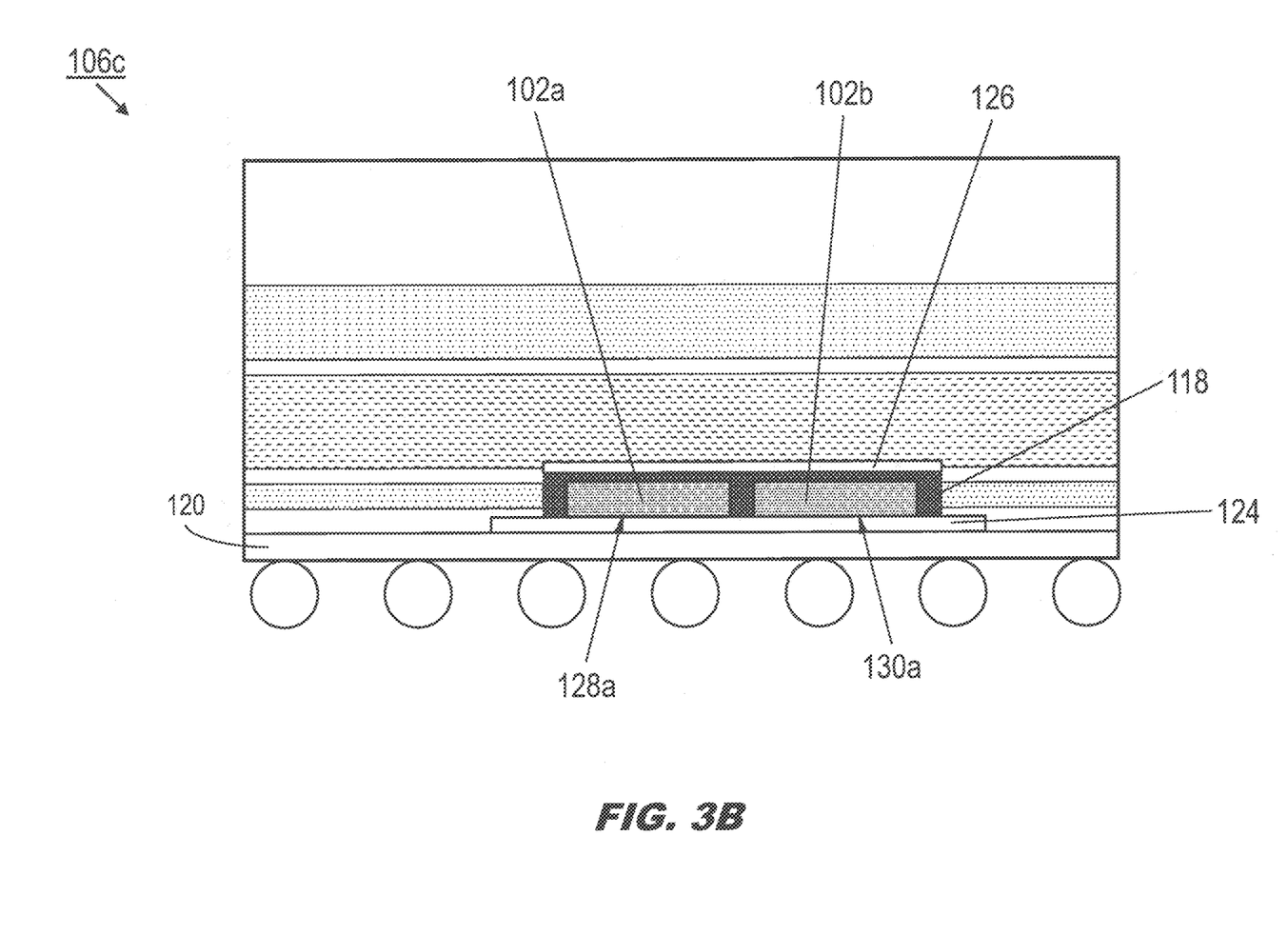

Referring to FIG. 3B, the hybrid die 106c may be implemented and may function similarly to the hybrid die 106b of FIG. 3A, except that the fabrication of the hybrid die 106c may involve the installation of multiple secondary dies 102a, 102b within a single cavity 118 set into the primary die 104. For example, the secondary dies 102a, 102b may be inserted into the cavity 118 (over previously installed shielding 126) with the active front sides 128a, 130a of the secondary dies oriented "downward" for interfacing with the RDL 120 via the interconnect layer 124.

Figure 3C:
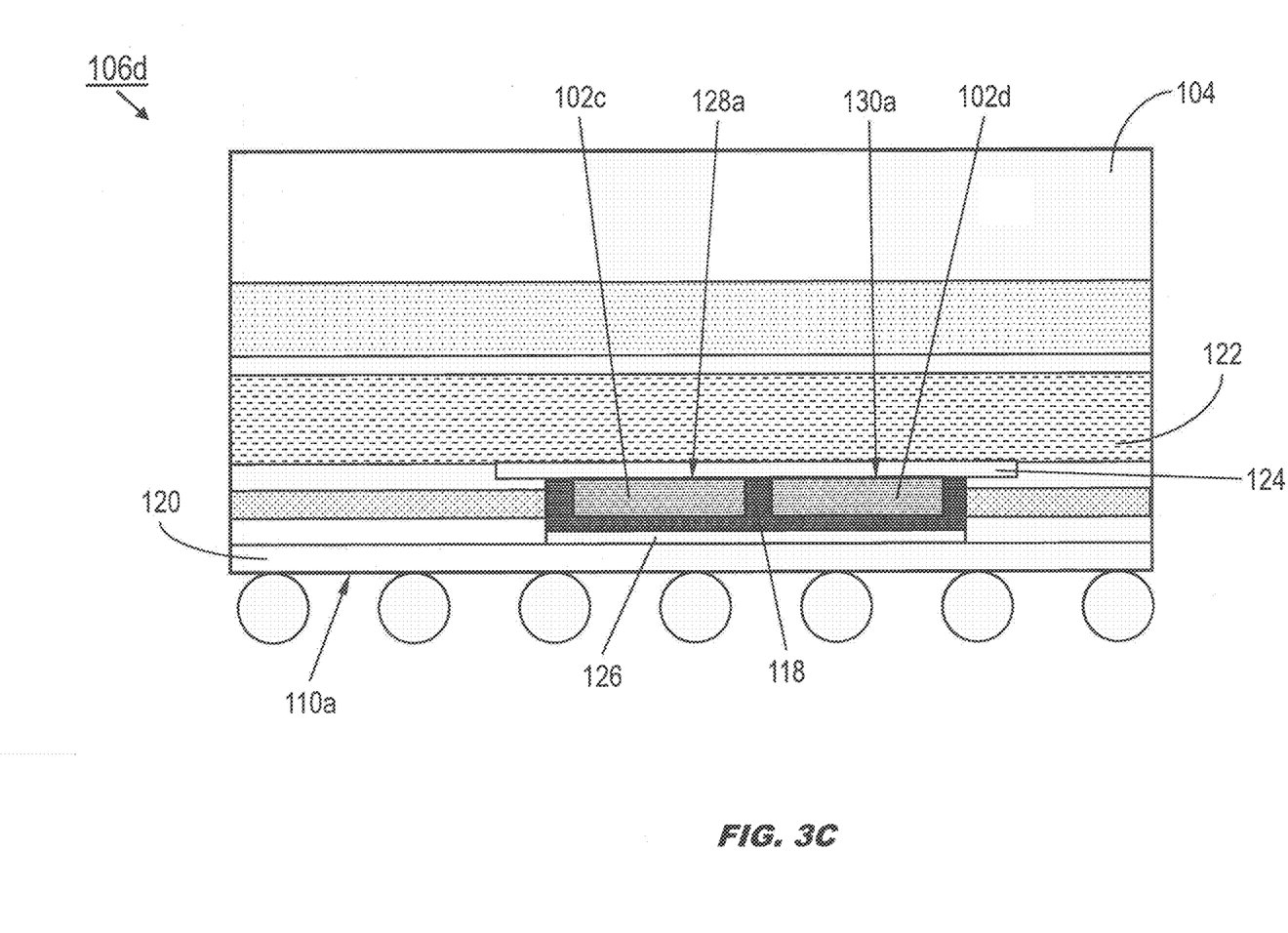

Referring to FIG. 3C, the hybrid die 106d may be implemented and may function similarly to the hybrid die 106c of FIG. 3B, except that the hybrid die 106d may incorporate one or more secondary dies (102c, 102d) installed and encapsulated into the cavity 118 oriented "upward", such that the active front sides 128a, 130a of the secondary dies 102c, 102d interact with the inner metal routing layers 122 of the primary die 104 (via interconnect layers 124). Shielding layers (126) may be proximate to the RDL 120 and active front side 110a of the primary die 104.

Figure 3D:
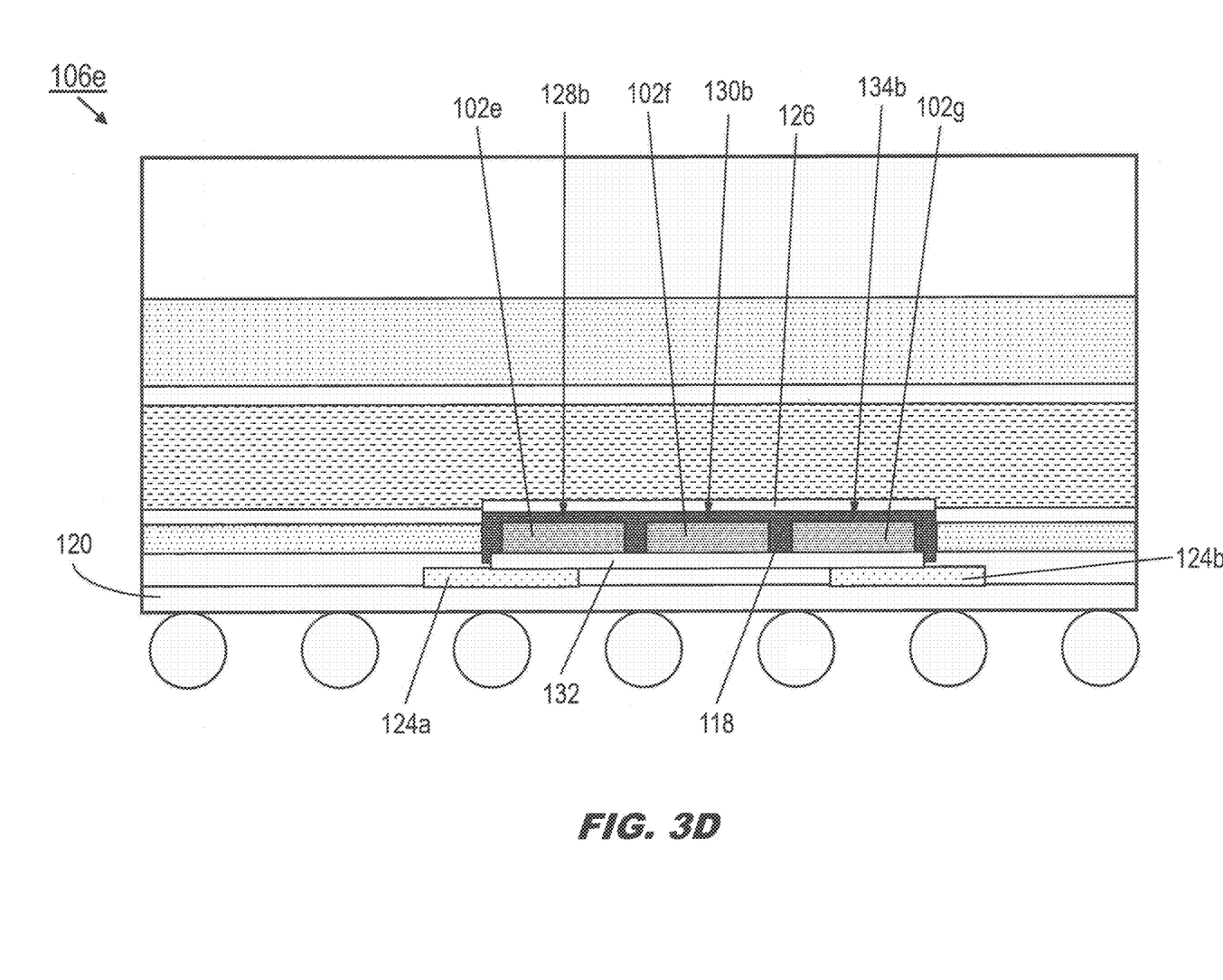

Referring to FIG. 3D, the hybrid die 106e may be implemented and may function similarly to the hybrid die 106c of FIG. 3B, except that the hybrid die 106e may incorporate a die-on-interposer assembly wherein multiple secondary dies 102e-g are oriented "downward" (e.g., wherein the back sides 128b, 130b, 134b of the secondary dies 102e-g face into the cavity 118, toward the shielding layer 126) for interaction with an interposer layer (132). The interposer layer 132 may in turn be oriented "downward" for interaction with the RDL 120 via interconnect layers 124a-b.

Figure 4:
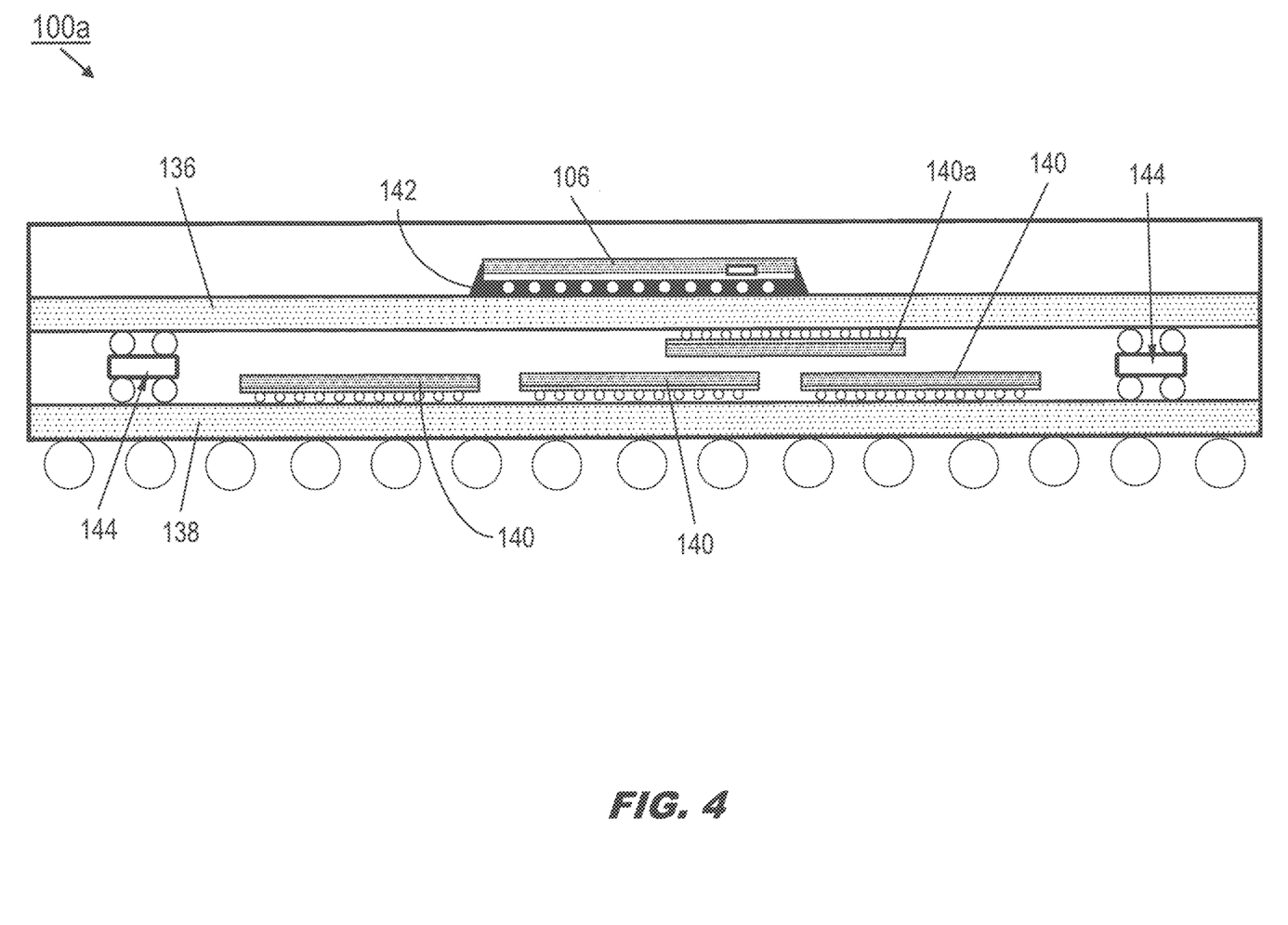
FIG. 4 illustrates the SIP of FIG. 1.

Referring to FIG. 4, the SIP 100a may be implemented and may function similarly to the SIP 100 of FIG. 1, except that the SIP 100a may incorporate multiple vertically integrated substrates 136, 138. For example, a lower substrate 138 may incorporate multiple COTS memory dies (140) or other like auxiliary dies stacked thereon, while the hybrid die 106 is attached (e.g., by underfilling (142)) to an upper substrate (along with additional auxiliary dies 140a). The upper and lower substrates 136, 138 may be connected by printed wiring board (PWB) perimeter standoff devices (144). The resulting assembly may be underfilled and encapsulated to form the SIP 100a.

Figure 5:
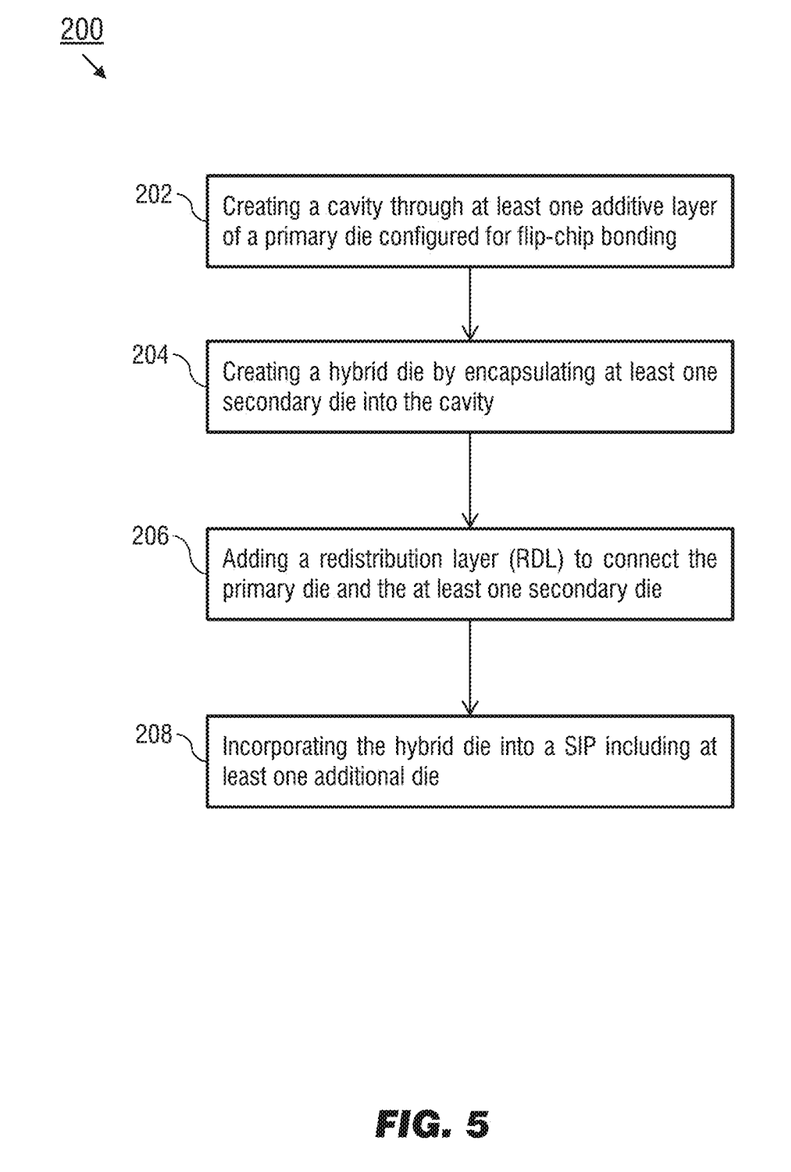
FIG. 5 illustrates an exemplary embodiment of a method for fabricating the SIP of FIG. 1.

Referring to FIG. 5, an exemplary embodiment of a method 200 according to the inventive concepts disclosed herein may be implemented for fabrication of the SIP 100 in some embodiments, and may include one or more of the following steps.

At a step 202, a cavity is milled or otherwise created within a primary ASIC die configured for flip-chip bonding. For example, the cavity may be created in the active front side of the primary die, partially removing solder bumps and outer passivation/metallization layers added by the flip-chip configuration.

At a step 204, a hybrid die is created by encapsulating at least one secondary die into the cavity. For example, the secondary die may be inserted so that its active surface is congruent with the active surface of the primary die and its inactive back surface is shielded, or in a "reverse" orientation such that the active surface of the secondary die is in contact (via interconnect layers) with internal routing layers of the primary die.

At a step 206, the primary and secondary dies are connected via the addition of a redistribution layer (RDL). The RDL may include one or more interconnect layers coupling the active surfaces of the primary and secondary dies to the RDL proper.

At a step 208, the resulting hybrid die is vertically integrated into an SIP including COTS memory dies or additional dies attached to substrates encapsulated within the SIP.

As will be appreciated from the above, systems and methods according to embodiments of the inventive concepts disclosed herein may provide post-foundry enhancement of trusted physical dies that allows for broad functionality while preserving the security and integrity of system and die components.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

We claim:

1. A system-in-package (SIP), comprising:
at least one hybrid die encapsulated within a vertically integrated package, the hybrid die comprising:
a primary die within which at least one cavity has been integrated, the primary die having one or more of a primary front surface, a primary back surface opposite the primary front surface, an internal logical layer, an internal routing layer, and an additive layer;
at least one secondary die encapsulated within the cavity and having a secondary front surface and a secondary back surface;
and
at least one additive redistribution layer (RDL) connecting the primary die and the secondary die.

2. The SIP of claim 1, wherein the primary die is configured for flip-chip bonding and the at least one additive layer is incorporated into the primary front surface, and the at least one additive layer includes at least one of a passivation layer, a metallization layer, and a solder bump.

3. The SIP of claim 2, wherein the cavity is integrated through the at least one additive layer.

4. The SIP of claim 3, wherein the one or more internal routing layers include:
at least one first internal routing layer through which the cavity is integrated;
and
at least one second internal routing layer remaining intact above the cavity.

5. The SIP of claim 1, wherein the at least one additive RDL is a first additive RDL, further comprising:
at least one second additive RDL including a first interconnect layer separating the primary front surface and the at least one secondary front surface from the first additive RDL.

6. The SIP of claim 5, further comprising:
at least one interposer layer separating the at least one secondary front surface from the first interconnect layer.

7. The SIP of claim 1, wherein the at least one additive RDL is added to one or more of the primary die and the secondary die by at least one of printing, metallization, and photolithography.

8. The SIP of claim 1, wherein the secondary die includes at least one of an electrically erasable programmable read-only memory (EEPROM) module, a Flash memory module, a non-volatile memory (NVM) module, and an analog-digital converter (ADC).

9. The SIP of claim 1, further comprising:
at least one first shielding layer separating the secondary back surface and the cavity.

10. The SIP of claim 1, further comprising:
at least one second shielding layer separating the at least one secondary back surface and the additive RDL;
and
at least one second interconnect layer separating the secondary front surface and the one or more internal routing layers.

11. The SIP of claim 1, further comprising:
at least one first substrate, the hybrid die attached to the first substrate;
at least one second substrate;
and
at least one standoff device connecting the first substrate to the second substrate.

12. The SIP of claim 11, wherein the first substrate has a first side attached to the hybrid die and a second side opposite the first side, further comprising:
at least one third die attached to the second side.

13. The SIP of claim 11, further comprising:
at least one fourth die attached to the second substrate.

14. A method for fabricating a system-in-package (SIP), the method comprising:
creating a cavity through at least one additive layer of a primary die configured for flip-chip bonding;
creating a hybrid die by encapsulating at least one secondary die into the cavity;
adding a redistribution layer (RDL) to connect the primary die and the at least one secondary die.

15. The method of claim 14, wherein creating a cavity through at least one additive layer of a primary die configured for flip-chip bonding includes:
creating a cavity through one or more of a passivation layer, a metallization layer, and a solder bump of the primary die.

16. The method of claim 14, further comprising:
incorporating the hybrid die into a SIP including at least one additional die.

17. The method of claim 14, wherein creating a hybrid die by encapsulating at least one secondary die into the cavity includes:
adding at least one shielding layer to the cavity; and
encapsulating the at least one secondary die over the shielding layer.

18. The method of claim 14, wherein creating a hybrid die by encapsulating at least one secondary die into the cavity includes:
adding at least one interconnect layer to the cavity; and
encapsulating the at least one secondary die over the interconnect layer.

\* \* \* \* \*